(12) United States Patent
Hartmann et al.

(10) Patent No.: US 9,048,450 B2
(45) Date of Patent: Jun. 2, 2015

(54) OLED DEVICE WITH A BRIGHTNESS DISTRIBUTION CONTROLLING MEANS

(75) Inventors: Sören Hartmann, Baesweiler (DE); Pieter Gijsbertus Maria Kruijt, Eindhoven (NL)

(73) Assignee: Koninklijkle Philips N.V., Eindhoven (NL)

( * ) Notice: Subject to any disclaimer, the term of this patent is extended or adjusted under 35 U.S.C. 154(b) by 75 days.

(21) Appl. No.: 13/879,430

(22) PCT Filed: Oct. 13, 2011

(86) PCT No.: PCT/IB2011/054522
§ 371 (c)(1),
(2), (4) Date: Apr. 15, 2013

(87) PCT Pub. No.: WO2012/052886
PCT Pub. Date: Apr. 26, 2012

(65) Prior Publication Data
US 2013/0200358 A1    Aug. 8, 2013

(30) Foreign Application Priority Data

Oct. 21, 2010 (EP) .................................... 10188411

(51) Int. Cl.
*H01L 51/52* (2006.01)
*H01L 51/56* (2006.01)
*H01L 27/32* (2006.01)

(52) U.S. Cl.
CPC .......... *H01L 51/5203* (2013.01); *H01L 27/3239* (2013.01); *H01L 51/5212* (2013.01); *H01L 2251/5361* (2013.01); *H01L 51/56* (2013.01)

(58) Field of Classification Search
CPC ............................ H01L 51/5212; H01L 51/56
See application file for complete search history.

(56) References Cited

U.S. PATENT DOCUMENTS

| 6,140,744 | A | 10/2000 | Bran |
| 2005/0236981 | A1 | 10/2005 | Cok et al. |
| 2005/0270464 | A1 | 12/2005 | Seo et al. |
| 2008/0231180 | A1 | 9/2008 | Waffenschmidt et al. |
| 2009/0284158 | A1 | 11/2009 | Parthasarathy et al. |

FOREIGN PATENT DOCUMENTS

| EP | 2144290 A1 | 1/2010 |
| WO | 2010036364 A1 | 4/2010 |

*Primary Examiner* — Elmito Breval
(74) *Attorney, Agent, or Firm* — Meenakshy Chakravorty

(57) ABSTRACT

The invention describes an OLED device (1) comprising an active layer (13) between a first electrode (11) and a second electrode (12); a contact means (3, 34, 35) for connecting the electrodes (11, 12) to a power supply (2); and a brightness distribution controlling means (20, 21, 21', 24, 24', 25, 25'), which brightness distribution controlling means (20, 21, 21', 24, 24', 25, 25') comprises a plurality of openings (20), wherein an opening (20) extends through the second electrode (12) and the active layer (13) to expose an area (21, 21') of the first electrode (11); and a plurality of selectively addressable current distribution lines (24, 24', 25, 25'), wherein a current distribution line (24, 24', 25, 25') is arranged to extend between a contact means (3, 34, 35) and an exposed area (21, 21') such that an electrical connection can be established between the power supply (2) and the first electrode (11) to (specifically) regulate the brightness of the active layer (13) in the vicinity of the exposed area (21, 21') accessed by that current distribution line (24, 24', 25, 25'), and whereby the current distribution lines (24, 24', 25, 25') are electrically connected to each other by means of the first electrode (11). The invention further describes an OLED lighting arrangement (4) comprising such an OLED device (1), a line regulation means (22) for regulating the current flow through a selectively addressable current distribution line (24, 24', 25, 25') between the contact means (3) and the first electrode (11) to regulate the brightness of the active layer (13) in the vicinity of the exposed area (21, 21') accessed by that current distribution line (24, 24', 25, 25'); and a brightness distribution controller (41) for controlling the line activation means (22) to address a specific current distribution line (24, 24', 25, 25'). The invention also describes a method of manufacturing an OLED device (1) with a brightness distribution controlling means (20, 21, 21', 24, 24', 25, 25'). The invention also describes a method of controlling the brightness of distribution of such an OLED device in such an OLED lighting arrangement.

14 Claims, 6 Drawing Sheets

OLED DEVICE WITH A BRIGHTNESS DISTRIBUTION CONTROLLING MEANS

FIELD OF THE INVENTION

The invention describes an OLED device with a brightness distribution controlling means, an OLED lighting arrangement comprising such an OLED device, a method of manufacturing such an OLED device, and a method of controlling the brightness distribution of such an OLED device.

BACKGROUND OF THE INVENTION

An organic light-emitting diode (OLED) device is manufactured by building up a series of layers, usually comprising an active or organic layer sandwiched between an anode and a cathode. A voltage is applied across the anode and cathode using contact pads arranged along one or more sides of the device, while the remainder of the device is encapsulated to protect the active layer from moisture. An OLED device can be top-emitting and/or bottom-emitting, depending on whether one or both of the electrodes are transparent. For example, for a bottom-emitting device, a transparent anode can be applied onto a transparent carrier such as glass using a layer of a transparent conducting oxide (TCO), for example indium tin oxide (ITO). The organic layer and the cathode are then applied onto the anode before the device is finally encapsulated. However, a transparent electrode is generally also associated with a poor lateral conductivity. As a result, the brightness over the light-emitting area in such a prior art OLED can noticeably drop off towards the centre. For OLEDs used in illumination applications requiring a homogenous brightness over the light-emitting area, this problem is usually circumvented by an additional structure of thin metal shunt lines applied onto the transparent electrode in order to enhance its conductivity. However, these shunt lines are limited in dimension in order to remain invisible from a certain distance.

Other types of OLED devices can comprise distinct regions, each with their own anode and/or cathode, so that each region is separately addressable. Such devices can be used to render images or patterns. However, the manufacture of such OLED devices is complex and cost-intensive, since one or more of the anode, active layer and cathode must be applied in a structured fashion, for example using photolithography or laser ablation, to obtain the desired structure.

It is therefore an object of the invention to provide a more economical OLED device and a more versatile OLED lighting arrangement.

SUMMARY OF THE INVENTION

This object is achieved by the OLED device of claim 1, by the OLED lighting arrangement of claim 10, and by the method according to claim 13 of manufacturing an OLED device.

According to the invention, the OLED device comprises an active or electroluminescent layer between a first electrode and a second electrode, and a contact means for connecting the electrodes to a power supply. The OLED device according to the invention further comprises a brightness distribution controlling means, which brightness distribution controlling means comprises a plurality of openings or vias, wherein an opening extends through the second electrode and the active layer to expose an area of the first electrode; and a plurality of selectively addressable current distribution lines, wherein a current distribution line is arranged to extend between a contact means and an exposed area such that an electrical connection can be established between the power supply and the first electrode to specifically regulate the brightness of the active layer in the vicinity of the exposed area accessed by that current distribution line, and whereby the current distribution lines are electrically connected to each other by means of the first electrode.

An advantage of the OLED device according to the invention is that the brightness distribution of the light-emitting area of the device can be regulated as desired and in any number of ways, for example in a static or a dynamic manner, as will be described below. Since a current distribution line (or 'power line') is selectively addressable to connect the power supply to the corresponding exposed area of the first electrode, a region or cell of the active layer in the vicinity of that exposed area can be made to emit light. Because of typically poor lateral conductivity of the material used for a transparent electrode, the brightness drops off with increasing distance from the exposed area of the first electrode. Equally, by grounding the current distribution line or by applying a negative current to the current distribution line, the region of the active layer in the vicinity of that exposed area can be made to remain 'dark' or to appear dark. By selectively driving the plurality of the current distribution lines in this way, a specific distribution of light-emitting and non-light-emitting regions or cells can be achieved. In this way, the OLED device according to the invention makes use of the generally poor lateral conductivity of an electrode to achieve a desired brightness distribution. Such an OLED device is therefore particularly suited to lighting applications in which individual lighting effects are desired. Furthermore, since the first electrode can easily be accessed electrically over the entire area of the device by means of the current distribution lines, the dimensions of the light emitting area are not subject to the same limitations as a prior art device that requires a homogenous and even light distribution. Another advantage is that it is not necessary to augment the conductivity of either of the electrodes using shunt lines. Also, unlike prior art devices, patterns can be rendered using such an OLED device without requiring any costly photolithography or patterned vapour deposition steps to obtain a structured anode.

According to the invention, the OLED lighting arrangement comprises such an OLED device, a line regulation means for regulating the current flow through a selectively addressable current distribution line between the contact means and the first electrode to regulate the brightness of the active layer in the vicinity of the exposed area accessed by that current distribution line, and a brightness distribution controller for controlling the line activation means to address specific current distribution lines.

According to the invention, the method of manufacturing an OLED device comprises the steps of constructing a stack of layers, which stack comprises a first electrode layer, an active layer, and a second electrode layer; applying a contact means for connecting the electrodes to a power supply; forming a number of openings extending through the second electrode and the active layer to expose a corresponding number of areas of the first electrode; and arranging a current distribution line of a plurality of current distribution lines to extend between a contact means and an exposed area to allow an electrical connection to be established between a power supply and the first electrode to regulate the brightness of the active layer in the vicinity of the exposed area accessed by that current distribution line, such that the current distribution lines are electrically connected to each other by means of the first electrode.

In the method according to the invention, the manufacture of the OLED device is particularly simple and straightforward, since the layers comprising the light-emitting area of the OLED do not require any additional structuring. Within the light-emitting area of the OLED, the stack of layers simply comprises successive, essentially even or uniform layers. Openings can be formed in a single-stage process, or can be formed in a number of consecutive process steps.

According to the invention, a method of controlling the brightness distribution of such an OLED device in an OLED lighting arrangement comprises the steps of identifying a first brightness-controllable region of the light-emitting area of the OLED device in which the active layer is to emit light and/or identifying a second brightness-controllable region of the light-emitting area of the OLED device in which the active layer is to emit less light or essentially no light compared to the first brightness-controllable region; and driving the brightness distribution controller to control the line activation means such that current flow through the current distribution lines to the openings in the first brightness-controllable region is increased and current flow through the current distribution lines to the openings in the second brightness-controllable region is decreased.

The dependent claims and the following description disclose particularly advantageous embodiments and features of the invention. Features of the embodiments may be combined as appropriate to arrive at further embodiments.

In the following, but without restricting the invention in any way, the first electrode and second electrode may be assumed to be the anode and cathode respectively, and the anode may be assumed to be transparent for a bottom-emitting device. The anode can comprise a suitable conductor such as indium tin oxide.

Depending on the lighting application for which the OLED device is intended, it may be desired to be able to render certain patterns or images using the light-emitting area of the OLED, whereby a 'pattern' or 'image' is to be understood to mean any shape or shapes rendered using light-emitting and non-light-emitting regions of the OLED device, whereby the contours or edges of the rendered shape may be 'soft' or blurred in transient regions between light-emitting and non-light-emitting regions. A 'light-emitting region' can be the region or cell surrounding a single exposed area, or can be a combined region given by several neighbouring cells. By deliberately allowing some regions of the light-emitting area to emit light and allowing other regions to remain 'dark' in comparison, almost any illumination pattern can be generated, whereby a soft illumination gradient is achieved between the 'bright' and 'dark' regions according to the conductivity of the anode. Of course, different regions of the device can be driven at different intensities. For example, any cell can be driven at full intensity, 50% intensity, 20% intensity, or indeed any suitable percentage of full intensity. Equally, a small negative current could be applied to the current distribution lines of one or more regions or cells so that the brightness gradient of the neighbouring regions or cells is enhanced.

The openings in the layer stack can be made in a random manner, i.e. so that the openings are distributed randomly over the light-emitting area of the OLED. However, a more regular arrangement may allow a greater range of patterns or images to be rendered. Therefore, in a particularly preferred embodiment of the invention, a light-emitting area of the OLED device is virtually divided into an array of brightness-controllable regions, and a number of openings is assigned to each brightness-controllable region, and a current distribution line extends from the contact means to an exposed area of each brightness-controllable region. Here, the term 'virtually divided' means that the light emitting area is not physically split or subdivided into separate areas, but remains a physically uninterrupted surface comprising a plurality of smaller regions or 'cells'. For example, the light-emitting area of the OLED device can be virtually divided into an M×N array, with M rows and N columns. Preferably, however, the light-emitting area is virtually divided into hexagonal cells. Such an arrangement gives a more favourable 'area of influence' around a contact means, since the form of a hexagonal cell approaches a circular shape. One or more openings can be formed in each cell of the array to expose the first electrode. Then, current distribution lines can be applied to connect these exposed areas to a contact pad of the OLED. Of course, a physical division of the light-emitting area of the OLED may also be carried out, so that the OLED comprises several independent light-emitting areas, wherein each of these in turn can be virtually divided into array of brightness-controllable regions.

Generally, an OLED device has contact pads along two or more sides of the device, and a contact pad is connected either to the anode and cathode, as well as being connected to the power supply. In one embodiment of the invention, current distribution lines can be arranged so that a group of current distribution lines is connected to a contact pad on one side of the device. In this way, for example, if contact pads on three sides of a square or rectangular device were available for the anode, three separate groups of power lines could be addressed independently of each other. However, such a device could only render a limited range of patterns. Therefore, in a particularly preferred embodiment of the invention, the contact means comprises a plurality of electrically separate contact areas, wherein a contact area is electrically connected to a power line. For example, a contact means along one side of the OLED could be divided into any feasible number of electrically isolated areas, and each of these contact areas can be connected to any number of current distribution lines. In this way, much more detailed patterns can be rendered, since a correspondingly greater number of exposed areas of the first electrode can be individually addressed. Any suitable technique could be used to form the contact areas. For example, in a particularly straightforward approach, a single contact pad or strip could be sub-divided into the required number of electrically separated areas by laser ablation. Alternatively, the separate contact areas could be achieved by deposition using a shadow mask.

As the skilled person will appreciate, it is important to ensure that the current distribution lines, whose purpose it is to supply the first electrode with current, do not come into contact with the second electrode. Therefore, in a preferred embodiment of the invention, a current distribution line comprises a line of electrically conductive material electrically isolated from the second electrode by an insulating layer. The insulating layer can comprise any dielectric or electrically insulating material that does not negatively affect the OLED's properties, e.g. SiN, SiO, SiON, $Al_2O_3$, $TiO_2$, photoresist, etc. A favourably dense distribution of individually controllable cells requires a corresponding dense arrangement of current distribution lines. However, the achievable density of the openings may be limited in a brightness distribution controlling means with current distribution lines arranged in a single layer, i.e. in which the current distribution lines are arranged essentially at the same level or in the same plane. Therefore, in a particularly preferred embodiment of the invention, the OLED device comprises a first set of current distribution lines arranged to access a first set of exposed areas of the first electrode; and a second set of current distribution lines arranged to access a second set of exposed areas of the first electrode, wherein the first set of current distribution lines is electrically isolated from the second set of current distribution lines by an insulating layer. In this way, the current distribution lines of the first and second sets of current distribution lines can be arranged closer together without running the risk of them touching each other.

The second insulation layer can be applied to only cover the current distribution lines of the first set, for example by printing the insulating material onto those current distribution lines, perhaps with a slight overlap along the sides of the current distribution lines onto the first insulation layer. Of course, the second insulation layer can simply be applied as a full-area coating to cover the first set of current distribution lines as well as the regions of the first insulation layer exposed between those current distribution lines.

Current distribution lines of the second set could be arranged essentially parallel to the current distribution lines of the first set. However, in a preferred embodiment of the invention, a current distribution line of the second set of current distribution lines crosses or traverses a current distribution line of the first set of current distribution lines. In this way, a denser arrangement of current distribution lines and exposed anode areas can be achieved. This in turn allows the rendering of more detailed patterns, since the exposed areas can be situated closer together. Of course, an OLED device according to the invention is not limited to two such sets of power lines. Any number of additional insulating layers can be applied, and any number of exposed areas can be formed in the anode, so that multiple criss-crossing layers of power lines can be applied to access these exposed areas. Such a dense arrangement of exposed anode areas can be advantageous, as the brightness homogeneity of the device can then be controlled in a very precise manner.

The current distribution lines or power lines can be applied using any suitable technique, for example by using a shadow mask in a deposition process. Alternatively, in a preferred embodiment of the invention, a power line comprises a line of electrically conductive material, for example a line of conductive adhesive or a conductive ink, applied onto an insulating layer.

The current distribution lines can be arranged relative to the exposed areas in a number of ways. For example, the current distribution lines can be arranged on the underside or in the body of a cover lid, so that each current distribution line terminates at a point corresponding to an exposed area of the anode. To make the connection between the end of the current distribution line and the exposed area, a globule or droplet of electrically conductive material, for example an electrically conductive ink, can be dropped onto the exposed area. In such an embodiment, the openings can be made relatively wide, so that the droplet protrudes above the level of the cathode but does not touch the cathode. When the cover lid is put into place, the end of each current distribution line will make contact with the surface of a droplet, while free space can act as an insulator between the second electrode and the current distribution lines. Alternatively, an insulating layer can be applied onto the second electrode, and the droplets can be dropped or printed into the openings, which in this case can be somewhat smaller, such that each droplet makes contact to the end of a current distribution line in the cover lid. In such a realisation, the contact means can comprise electrically separate contact areas arranged at the outer edge of the cover lid for ease of connection to a power supply. Of course, layers of current distribution lines and appropriate insulating layers can be applied onto the device layer stack while other layers of current distribution lines and appropriate insulating layers can be applied onto the cover lid. Such a combination could make it possible to contact a particularly dense arrangement of exposed anode areas.

In a preferred embodiment of the invention, an insulating layer is applied over the second electrode before the openings are formed. An opening is then formed to extend through the insulating layer, the second electrode, and the active layer to expose the first electrode. A current distribution line can then be applied onto the insulating layer to terminate on the exposed area of the first electrode. For example, the current distribution line can be applied by printing a line of electrically conductive material onto the insulating layer. The extremely thin layer thicknesses of the active layer, second electrode and insulating layer allow a precise termination of the current distribution line on the exposed area. In such a realisation, a first set of current distribution lines can be applied or printed onto a first insulating layer to access a first set of exposed areas of the first electrode, and a second insulating layer can be applied onto the first set of current distribution lines. Then, in a subsequent step, a second set of current distribution lines can be applied or printed to access another set of exposed areas.

Since each current distribution line or power line requires a means of connecting it to the power supply, but the available contact pad area on one side of an OLED device is limited, it may be preferable to apply the current distribution lines such that contact pads on adjacent sides can be used.

Layers of an OLED device are generally very thin, for example the layer stack comprising electrodes and active layer can have a combined thickness of only a few hundred nanometers, while the insulation layer can have a thickness in the region of 0.9 micrometer or more in the case of organic insulators, and even lower for inorganic layers (e.g. 20 nm up to several hundreds of nanometers). The conductivity of a power line may depend on the material used and the thickness of the line. Preferably, a current distribution line has a thickness or height of at least 100 nm.

The OLED device according to the invention could be manufactured so that the anode and cathode are each connected to contact pads in the usual manner, with additional contact areas set aside for current distribution lines for accessing exposed areas of the anode. During operation, such a device could exhibit essentially constantly illuminated outer areas in the region of the anode's contact pad, and controllable brightness areas in the neighbourhood of the exposed areas. However, it may be desirable to control the brightness distribution over the entire light-emitting area of the OLED. Therefore, in a particularly preferred embodiment of the invention, the first electrode is connected to the power supply solely by means of the current distribution lines. In this way, the brightness distribution can be controlled for the entire light-emitting area, allowing more versatile applications.

In order to obtain a light-emitting area without any noticeable dark 'holes', the openings are preferably kept as small as possible. This may be achieved by drilling or milling using a very fine tool. However, the size of an opening achievable using such a technique may not be as fine as desired, and the tip of such a tool may also remove material from the anode. Therefore, in a particularly preferred embodiment of the invention, the openings or holes can be formed by directing a beam of laser light at a region of the stack to ablate material from that region. Such a laser beam can remove very small amounts of material to the exact depth required, leaving the anode undamaged and making a favourably regular opening, for example a circular hole with a diameter in the region of 1 µm to 1000 µm (micrometers). Such small openings are effectively invisible to the human eye from a certain distance, for example from a typical viewing distance. Furthermore, in a bottom-emitting device, the power lines are also essentially invisible, since these are positioned 'behind' the layer stack. Therefore, particularly when several insulating layers are applied to allow crossing power lines to access a large number of openings, the favourably dense distribution of openings and the favourably small size of the ensuing cells allows relatively 'detailed' images or patterns to be rendered using such an OLED device. With increasing viewing distance, the soft contour transitions between bright and dark regions of an image rendered on an OLED device according to the invention may appear to the viewer to be relatively 'sharp'.

Once the holes are formed using the preferred technique, the current distribution lines can be applied, for example using a printing technique. After completion of these steps, the OLED device can be encapsulated in any suitable manner to protect the organic layer from moisture. If a hermetic seal is not formed, the OLED device preferably includes a getter between the device layer stack and the cover lid.

Obviously, an OLED lighting arrangement according to the invention can be used to render any number of patterns. Therefore, in a particularly preferred embodiment of the invention, the OLED lighting arrangement comprises a memory for storing a number of brightness distribution patterns, and a brightness distribution controller realised to control the line activation means of the OLED device according to a brightness distribution pattern. For example, several patterns can be stored in a suitable format, for example a bitmap, in the memory. The patterns can then be rendered in a predefined sequence. For an OLED lighting arrangement used as a decorative lighting appliance in a home environment, an attractive sequence of patterns could be rendered slowly over time, for example clouds, abstract images, etc. or simply random patterns. In a public environment, and with a suitably large light-emitting area, the OLED lighting arrangement could be used to render a sequence of pictograms such as exit signs, no-smoking signs, etc, and may render such an image steadily for a predefined time, or may alternate between the image and its negative, etc.

In a preferred embodiment of the invention, a user can determine which image or pattern the OLED device should render. Therefore, in a further preferred embodiment of the invention, the OLED lighting arrangement comprises an interface for inputting a brightness distribution pattern, for example any desired image. The brightness distribution controller is preferably also capable of scaling such an image to the size of the light-emitting area. The OLED lighting arrangement also preferably comprises an interface for allowing the user to determine the rendering sequence, the duration of each rendered pattern, and the manner in which each pattern is to be rendered. In this way, a user could, for example, configure the OLED lighting arrangement to render patterns that slowly fade in and out, or a video sequence, etc.

The OLED device according to the invention can also be driven to achieve a homogenous and even light distribution, by simply allowing current to flow between the power supply and essentially all of the exposed areas of the first electrode using essentially all of the current distribution lines, and by biasing each current distribution line by the essentially the same amount.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the diagrams, like numbers refer to like objects throughout. Elements of the diagrams are not necessarily drawn to scale, particularly the OLED device layer thicknesses and the dimensions of the openings and the current distribution lines.

DETAILED DESCRIPTION OF THE EMBODIMENTS

Figure 1:
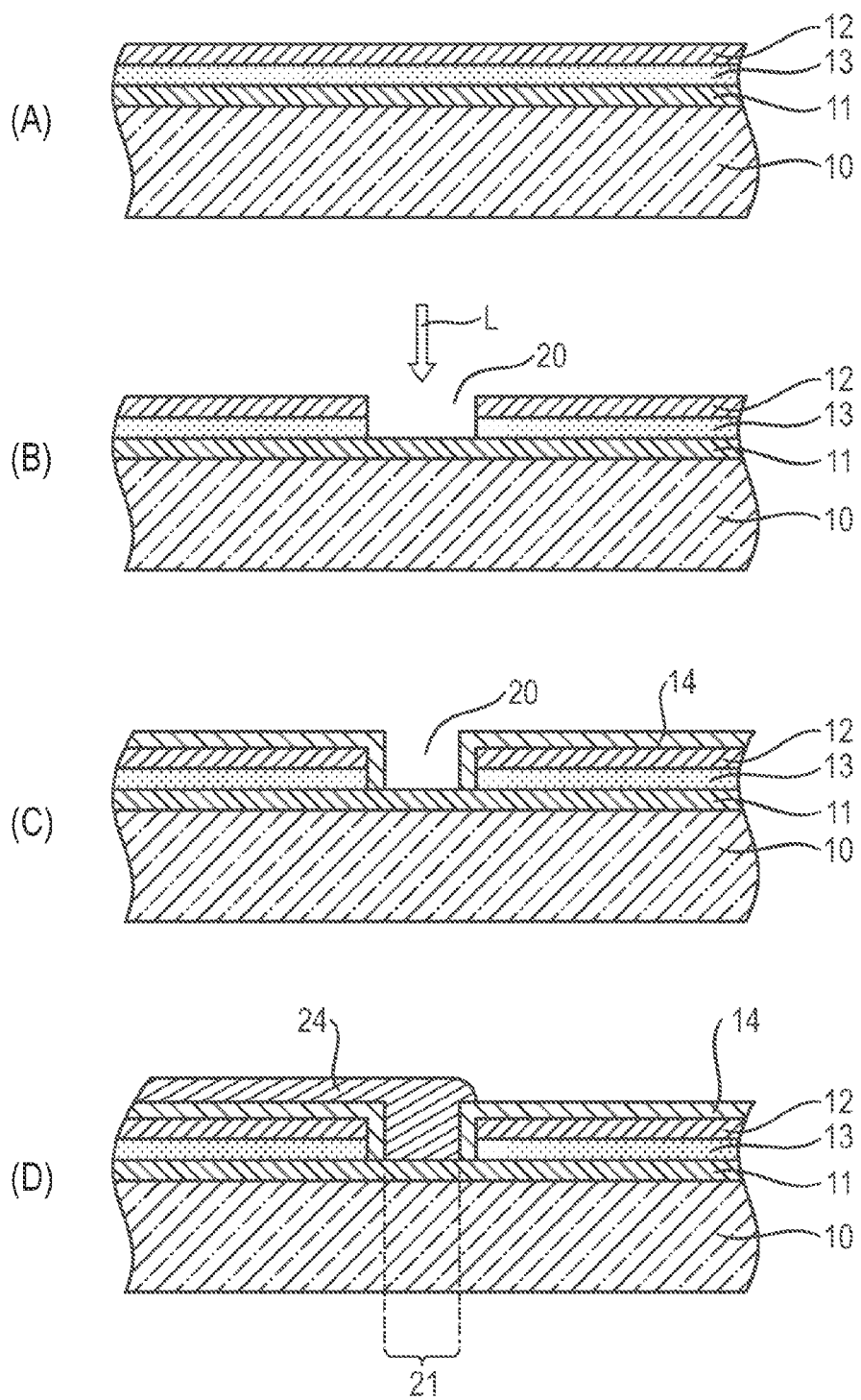
FIG. 1 shows a cross-section through a layer stack, illustrating steps of the method of manufacturing an OLED device according to the invention.

FIG. 1 shows a cross-section through a stack of layers 10, 11, 12, 13 for an OLED device according to the invention (whereby the layer thicknesses for the electrodes 11, 12 and the active layer 13 are shown to be greatly exaggerated) Initially, as shown in step A, a first electrode 11 is applied to a carrier 10; an active or electroluminescent layer 13 is applied onto the first electrode 11, and a second electrode 12 is applied onto the active layer 13. These layers 11, 12, 13 can all be applied successively using a suitable technique such as spin coating to ensure favourably thin and even layers without any cost-intensive structuring. In step B, an opening 20 is formed in the stack of layers 11, 23, 13 by directing a laser beam L at a specific region and ablating material of the second electrode 12 and active layer 13 at that region. In this way, an area 21 of the first electrode 11 is exposed. In a subsequent step C, an insulating layer 14 is applied to coat the second electrode 12 as well as the side walls of the opening 20, avoiding the exposed area of the first electrode 11. Again, the thickness of this layer is exaggerated in the diagram. The insulating material 14 can be printed as a thin layer onto the second electrode 12 such that the insulating material 14 overlaps slightly onto the exposed area 21 of the first electrode 11 to ensure that the second electrode 12 remains electrically isolated from the first electrode 11, as indicated in the diagram. Finally, a current distribution line 24 is printed onto the insulating layer 14 such that the material of the current distribution line 24 makes contact with the exposed area of the first electrode 11. In the embodiment shown, the first electrode 11 can be applied using a TCO such as indium tin oxide, which is known to have a poor lateral conductivity. The second electrode 12 can be any suitable conducting material such as aluminium, copper, gold, etc. The active layer 13 can comprise one or more layers of any suitable organic or inorganic electroluminescent material, as well as any number of additional hole/electron emitting and transport layers, as appropriate. The substrate 10 can be a transparent glass or plastic layer for a bottom emitting device.

Figure 2:
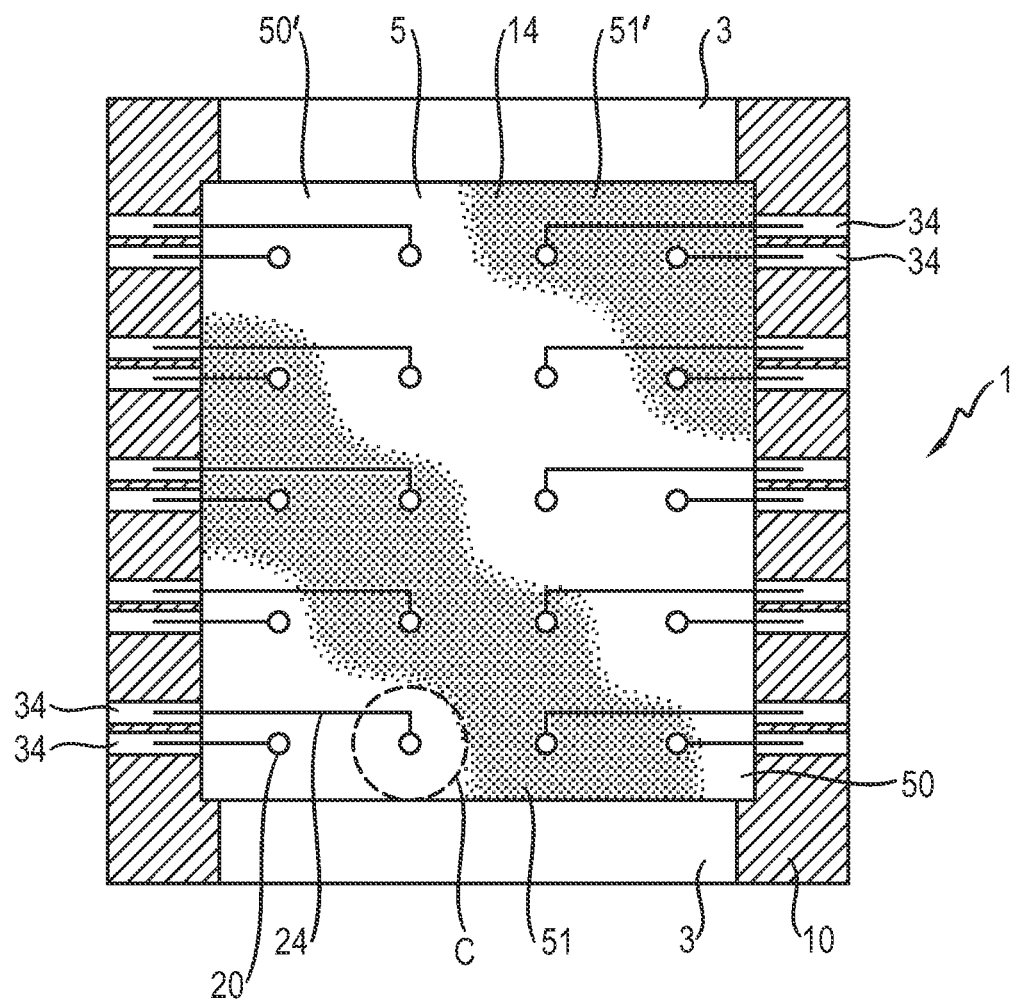
FIG. 2 shows a plan view of an OLED device according to a first embodiment of the invention.

A very simplified plan view of an OLED device 1 manufactured in this way is shown in FIG. 2. Here, a plurality of current distribution lines 24 is shown, whereby each current distribution line 24 electrically connects the first electrode (through an opening 20) to a contact area 34 of a contact pad 3 on the substrate 10 along the side of the OLED device 1. Here, only a few openings 20 and current distribution lines 24 are shown. An OLED device with a light-emitting area of 25 cm$^2$, made using the method according to the invention, could easily have an array of tens or hundreds of openings (or even more) and a corresponding number of current distribution lines 24. During operation, a voltage is applied between the electrodes of the device 1 (for the sake of clarity, the power source is not shown). In contrast to a prior art OLED device, in which efforts are made to augment the conductivity of the first electrode in order to achieve a homogenous brightness over the entire light emitting area, the OLED device 1 of the embodiment shown deliberately makes use of the low lateral conductivity of the first electrode. A region or cell C in the vicinity of an opening 20 can only emit light as long as a potential difference is maintained between a power supply and the exposed area of the first electrode, in which case current can flow through the current distribution line 24 between the power supply and the exposed area of the first electrode in that opening 20. The diagram shows one such cell C, and it will be understood that each opening 20 is effectively in the middle of such a cell C or area of influence. Because of the poor conductivity of the TCO, the brightness of the electroluminescent material decreases gradually as the distance from the opening 20 increases. In this embodiment, some regions of the light emitting area of the OLED device 1 are caused to emit light, while others remain 'dark'. This is achieved by connecting some current distribution lines 24 to the power supply, while other current distribution lines 24 are disconnected from the power supply. As shown in the diagram, selective control of the current distribution lines 24 results in certain bright regions 50, 50' blending into dark regions 51, 51' with a soft brightness gradient between the bright regions 50, 50' and dark regions 51, 51'. Obviously, the brightness distribution can be controlled in a dynamic manner, so that a shifting or changing pattern can be generated as desired. Equally, the current distribution lines 24, 25 can all be addressed in order to provide a uniformly bright or homogenous light-emitting area over the entire surface.

Figure 3:
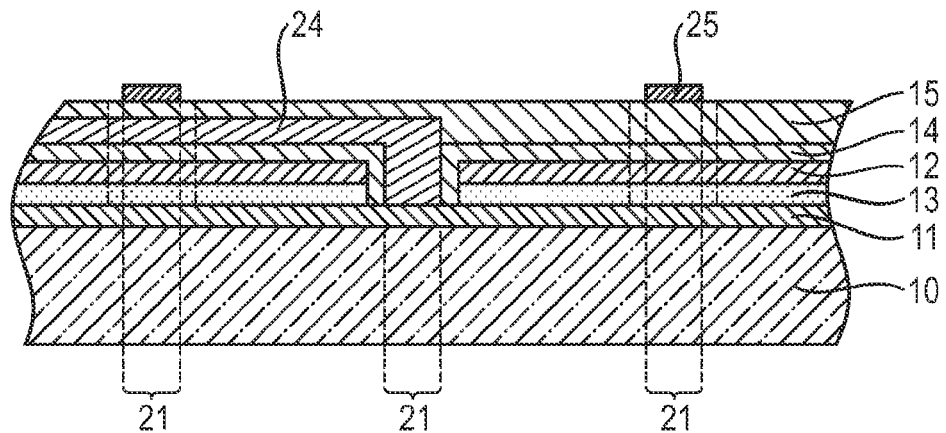
FIG. 3 shows a cross-section through an OLED device according to a second embodiment of the invention.

FIG. 3 shows a partial cross section through the layer stack of a partially completed OLED device according to a second embodiment of the invention. Here, an additional insulating layer 15 is applied to cover the first insulating layer 14 and a first set of current distribution lines 24. Another plurality of openings is made (indicated by the vertical dotted lines) to expose further areas of the first electrode 11, and a second set of current distribution lines 25 is applied onto the second insulating layer 15, traversing the current distribution lines 24 of the first set.

Figure 4:
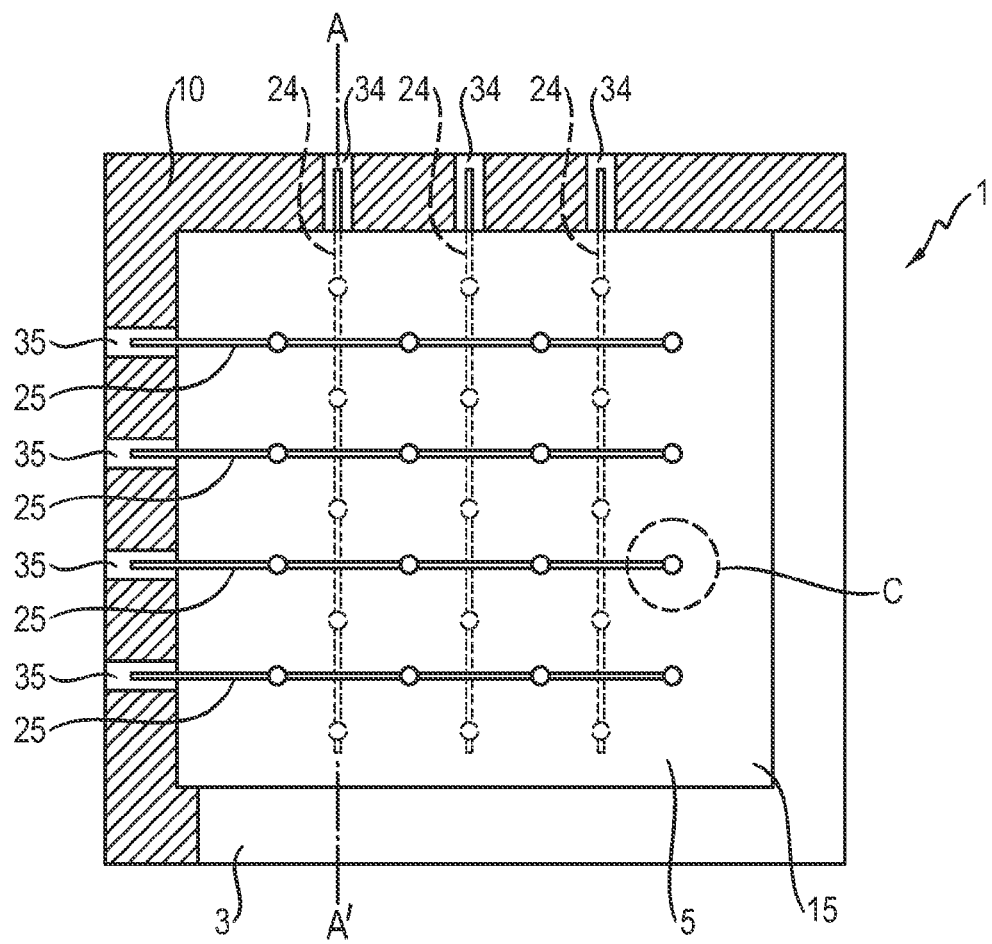
FIG. 4 shows a plan view of the OLED device of FIG. 3.

FIG. 4 shows a plan view of an OLED device 1 manufactured using the technique described in FIG. 3, which shows part of a cross-section A-A' along a along a current distribution line 24. Here, the first set of current distribution lines 24 is connected to a power supply (not shown in the diagram) by means of the contact areas 34 on one side of the OLED device 1, while the second set of current distribution lines 25 is connected to the power supply by means of the contact areas 35 on another side of the OLED device 1. Again, by selecting which current distribution lines 24, 25 to drive or address, specific regions or cells C of the OLED 1 can be caused to emit light while other regions remain dark, and a soft gradient is obtained between the bright regions and the dark regions.

Figure 5:
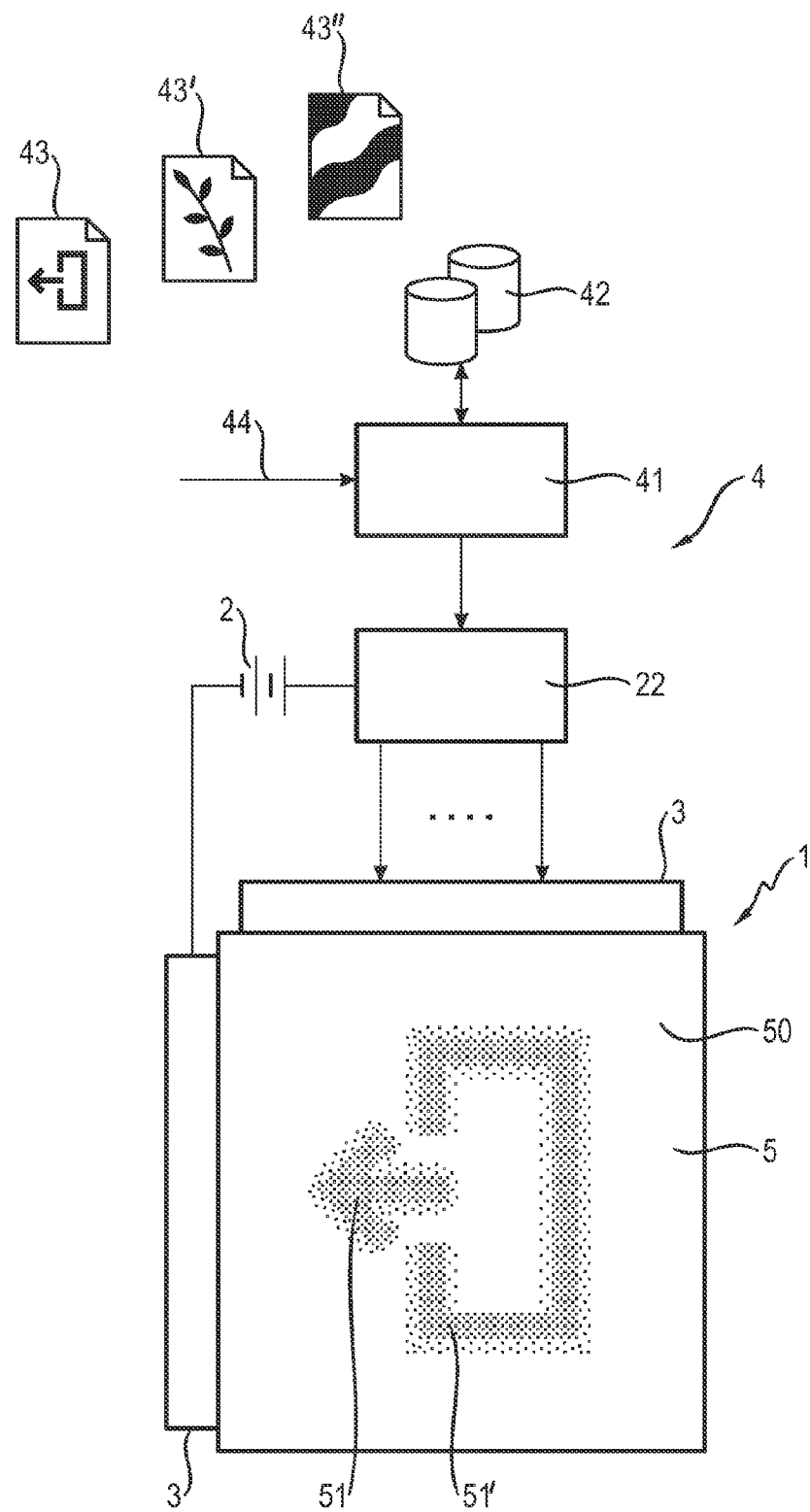
FIG. 5 shows a schematic representation of an OLED lighting arrangement according to an embodiment of the invention.

FIG. 5 shows a schematic representation of an OLED lighting arrangement 4 according to an embodiment of the invention. This diagram shows an OLED device 1, which can be manufactured using the methods described above, and a line activation means 22 for selectively addressing the current distribution lines of the OLED device, i.e. for selectively connecting these to, or disconnecting them from, a power supply 2. The line activation means 22 is controlled by a brightness distribution controller 41, which in turn obtains information about a pattern to be rendered from a memory 42. In the diagram, a number of patterns 43, 43', 43" are indicated, which can be stored in some suitable format, for example a bitmap, in the memory 42. The patterns can be sharply defined, while the rendered result will show a soft gradient between 'bright' (light-emitting regions) and 'dark' (non-light-emitting regions). The brightness distribution controller 41 can convert or translate a pattern into an array of 'on' and 'off' openings of the OLED device 1 according to the manner in which the openings are arranged in the light emitting area of the OLED. This information can also be supplied to the distribution controller 41, for example in a previous configuration step over a suitable interface 44. The distribution controller 41 then generates a suitable signal for the line activation means 22 to selectively allow current to flow through certain current distribution lines to cause the OLED to emit light around the corresponding openings, and to selectively prevent current from flowing through other current distribution lines, so that the regions around those corresponding openings remain dark, with a soft gradient between the bright regions 50 and dark regions 51, 51'. To this end, the activation means 22 might comprise a series of switches, one for each current distribution line, to selectively connect or disconnect the current distribution lines from the power supply. Of course, the line activation means 22 can be driven to smoothly regulate the current flowing through a current distribution line. Instead of just turning a region of the OLED light emitting area 'on' or 'off', the current through the current distribution lines can be increased or decreased, for example to any level between a certain maximum and a minimum, so that the brightness distribution of the OLED device can be controlled very finely. The skilled person will be familiar with the components that could be used for these purposes, for example any suitable off-the-shelf IC. The patterns thus rendered can therefore vary over time, can alternate between a positive pattern and a negative pattern, or one pattern of a sequence can blend into another, etc.

Figure 6:
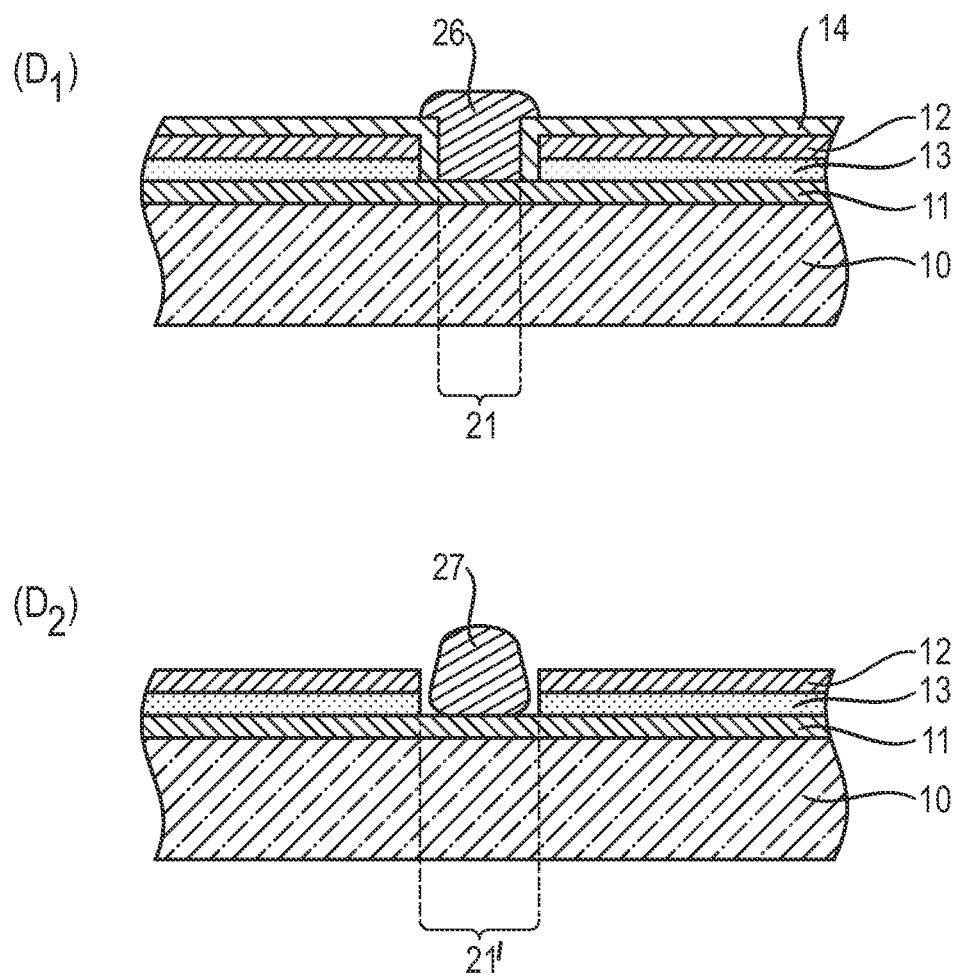
FIG. 6 shows two cross-sections through a layer stack showing alternatives to a method step of FIG. 1.

FIG. 6 shows two cross-sections through OLED devices showing further possible ways of contacting an exposed area of the anode. In step D$_1$, which is to be understood to be an alternative to step D of FIG. 1, a droplet 26 or globule 26 of electrically conductive material is dropped into the opening previously formed in step C to coat the exposed area 21 of the anode 11. The droplet 26 can fill the opening and spill over the top edges of the opening, since the insulating layer 14 prevents a short circuit between anode 11 and cathode 12. If the step of applying an insulating layer is omitted, and the openings are made larger, step B of FIG. 1 can be followed by the alternative step D$_2$ shown here, in which a droplet 27 or globule 27 of electrically conductive material is dropped into the opening to partially coat the exposed area 21' of the anode 11. The droplet 27 is smaller in width than the opening, so that free space acts as an insulator between anode 11 and cathode 12. The droplet 27 can protrude above the level of the cathode 12.

Figure 7:
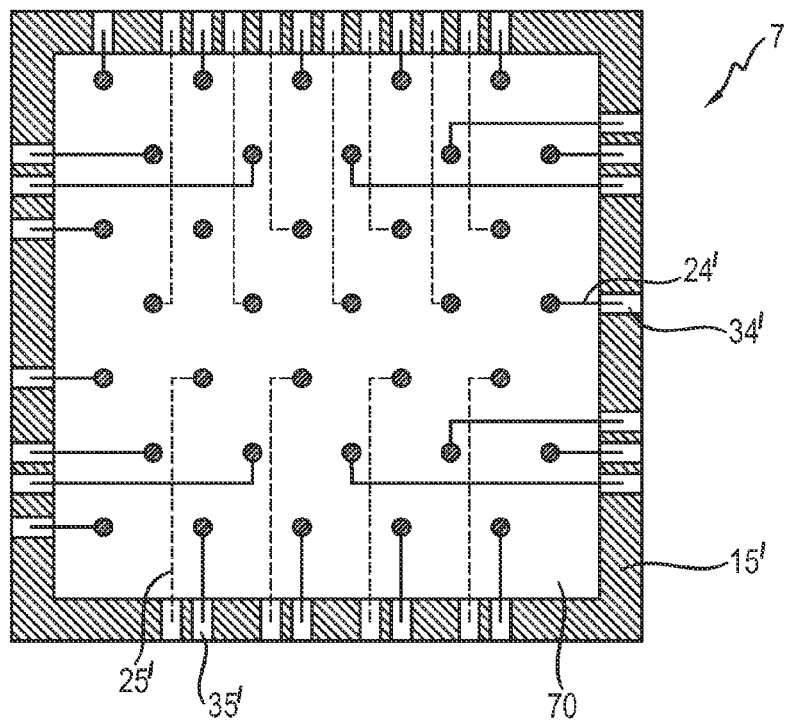
FIG. 7 shows a schematic representation of a cover lid for an OLED device according to a further embodiment of the invention.

FIG. 7 shows a schematic representation of a cover lid 7 for an OLED according to an embodiment of the invention. Here, current distribution lines 24', 25' are formed as part of the cover lid 7, so that one set of current distribution lines 25' (indicated by the broken lines) is enclosed within the body of the cover lid 7, and another set of current distribution lines 24' (indicated by the solid lines) is printed onto the underside 70 of the cover lid 7. The current distribution lines 24', 25' terminate at contact areas 34', 35' arranged along the outer edges of the cover lid 7.

Figure 8:
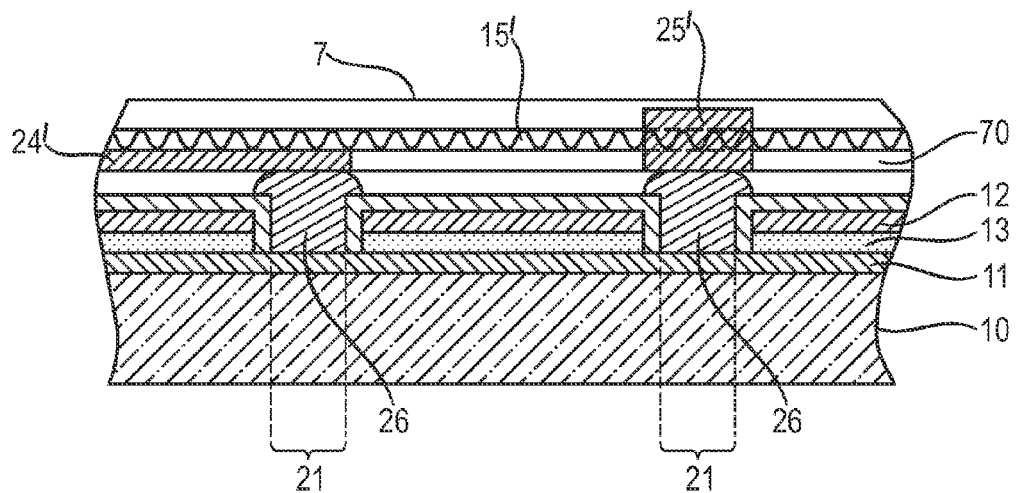
FIG. 8 shows a cross-section through an OLED device and a cover lid according to FIG. 7.

FIG. 8 shows a partial cross-section through an OLED device and such a cover lid 7. In this embodiment, the OLED has been manufactured using step $D_1$ of FIG. 6, and the droplets 26 are contacted through the cover lid 7 to connect the exposed areas 21 of the first electrode 11 to the power supply. Current distribution lines 24', 25' extend from the contact means and the edge of the cover lid 7 and terminate above the droplets 26. In this way, each exposed area can be contacted through a current distribution line 24', 25' in the cover lid 7.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art from a study of the drawings, the disclosure, and the appended claims. For example, the current distribution lines can be applied with varying densities for different regions of the OLED's light-emitting area, so that a specific region with a low density of current distribution lines is deliberately poorly supplied with current, while other areas are given a high density of current distribution lines, so that these areas can be used to render patterns. For the sake of clarity, it is to be understood that the use of "a" or "an" throughout this application does not exclude a plurality, and "comprising" does not exclude other steps or elements. The mere fact that certain measures are recited in mutually different dependent claims does not indicate that a combination of these measures cannot be used to advantage. Any reference signs in the claims should not be construed as limiting the scope.

The invention claimed is:

1. An OLED device comprising
   an active layer between a first electrode and a second electrode;
   a contact means for connecting the electrodes to a power supply; and
   a brightness distribution controlling means, which brightness distribution controlling means comprises
   a plurality of openings, wherein an opening extends through the second electrode and the active layer to expose an area of the first electrode;
   a plurality of selectively addressable current distribution lines,
   wherein a current distribution line is arranged to extend between a contact means and an exposed area such that an electrical connection can be established between the power supply and the first electrode to regulate the brightness of the active layer in the vicinity of the exposed area accessed by that current distribution line, and
   whereby the current distribution lines are electrically connected to each other by means of the first electrode;
   a light emitting area divided into an array of brightness controllable regions and
   a number of openings assigned to each brightness controllable region;
   wherein at least one current distribution line extends from the contact means to an exposed area of each brightness controllable region.

2. An OLED device according to claim 1, wherein the contact means comprises a plurality of electrically separate contact areas, and wherein a contact area is electrically connected to a current distribution line.

3. An OLED device according to claim 1, wherein a current distribution line comprises a line of electrically conductive material electrically isolated from the second electrode by an insulating layer.

4. OLED device according to claim 1, comprising
   a first set of current distribution lines for accessing a first set of exposed areas of the first electrode; and
   a second set of current distribution lines for accessing a second set of exposed areas of the first electrode;
   wherein the first set of current distribution lines is electrically isolated from the second set of current distribution lines by an insulating layer.

5. An OLEO device according to claim 4, wherein a current distribution line of the second set of current distribution lines crosses a current distribution line of the first set of current distribution lines.

6. OLED device according to claim 5, comprising an insulating layer applied onto the second electrode, wherein an opening extends through the insulating layer, the second electrode and the active layer to expose an area of the first electrode, and wherein a current distribution line is applied onto the insulating layer.

7. An OLED device according to claim 5, wherein a current distribution line has a height of at least 100 nm.

8. An OLED device according to claim 5, wherein the first electrode is connected to the power supply solely by means of the current distribution lines.

9. An OLED lighting arrangement comprising
   an OLED device according to claim 5;
   a line regulation means for regulating the current flow through a selectively addressable current distribution line between the contact means and the first electrode to regulate the brightness of the active layer in the vicinity of the exposed area accessed by that current distribution line; and
   a brightness distribution controller for controlling the line activation means to address a specific current distribution line.

10. An OLED lighting arrangement according to claim 9, comprising a memory for storing a number of brightness distribution patterns, and wherein the brightness distribution controller is realised to control the line activation means of the OLED device according to a brightness distribution pattern.

11. OLED lighting arrangement according to claim 9, comprising an interface for inputting a brightness distribution pattern.

12. A method of manufacturing an OLED device with a brightness distribution controlling means, which method comprises the steps of
   constructing a stack of layers, which stack comprises a first electrode layer, an active layer, and a second electrode layer;
   applying a contact means for connecting the electrodes to a power supply;
   forming a light emitting area divided into an array of brightness controllable regions;
   forming a number of openings assigned to each brightness controllable region and extending through the second electrode and the active layer to expose a corresponding number of areas of the first electrode;
   arranging a current distribution line of a plurality of current distribution lines to extend between a contact means and an exposed area to allow an electrical connection to be established between a power supply and the first electrode to regulate the brightness of the active layer in the vicinity of the exposed area accessed by that current distribution line, such that the current distribution lines are electrically connected to each other by means of the first electrode, wherein at least one current distribution line extends from the contact means to an exposed area of each brightness controllable region.

13. A method according to claim 12, wherein the openings are formed by directing a beam of laser light (L) at a region of the stack to ablate material from that region.

14. An OLED device comprising
an active layer between a first electrode and a second electrode;
a plurality of electrically separate contact areas each of which are electrically connected to a current distribution line for connecting the electrodes to a power supply; and
a brightness distribution control system which includes a plurality of openings extending through the second electrode and the active layer to expose an area of the first electrode;
a plurality of selectively addressable current distribution lines;

wherein each current distribution line is arranged to extend between a respective contact area and the exposed area of first electrode such that an electrical connection can be established between the power supply and the first electrode to regulate the brightness of the active layer in the vicinity of the exposed area accessed by that current distribution line;

each of the current distribution lines electrically connected to each other by the first electrode;

a light emitting area divided into an array of brightness controllable regions, each brightness controllable region having an opening;

wherein at least one current distribution line extends from the contact area to an exposed area of each brightness controllable region.

* * * * *